United States Patent [19]

Chiu

[11] Patent Number: 5,989,752

[45] Date of Patent: *Nov. 23, 1999

[54] RECONFIGURABLE MASK

[76] Inventor: Tzu-Yin Chiu, 700 Cardiff Pl., Milpitas, Calif. 95035

[ * ] Notice: This patent issued on a continued prosecution application filed under 37 CFR 1.53(d), and is subject to the twenty year patent term provisions of 35 U.S.C. 154(a)(2).

[21] Appl. No.: 08/654,985

[22] Filed: May 29, 1996

[51] Int. Cl.$^6$ .................................................. G03F 9/00
[52] U.S. Cl. ................... 430/5; 430/19; 430/20
[58] Field of Search ................... 430/5, 19, 20

[56] References Cited

U.S. PATENT DOCUMENTS

| | | | |
|---|---|---|---|
| 2,629,956 | 3/1953 | Switzer | 41/26 |
| 4,013,466 | 3/1977 | Klaiber | 96/36 |
| 4,229,520 | 10/1980 | Bratt et al. | 430/430 |
| 4,828,947 | 5/1989 | Sato et al. | 430/430 |
| 4,837,097 | 6/1989 | Narang et al. | 430/5 |
| 4,847,183 | 7/1989 | Kruger | 430/430 |
| 5,045,419 | 9/1991 | Okumura | 430/20 |
| 5,135,609 | 8/1992 | Pease et al. | 156/654 |
| 5,189,549 | 2/1993 | Leventis et al. | 359/271 |
| 5,302,477 | 4/1994 | Dao et al. | 430/5 |
| 5,334,467 | 8/1994 | Cronin et al. | 430/5 |
| 5,389,474 | 2/1995 | Iguchi et al. | 430/5 |
| 5,415,951 | 5/1995 | Miyazaki | 430/430 |
| 5,442,184 | 8/1995 | Palmer et al. | 250/442 |
| 5,444,330 | 8/1995 | Leventis et al. | 313/506 |
| 5,624,773 | 4/1997 | Pforr et al. | 430/430 |

OTHER PUBLICATIONS

Coates, David, "Smectic A LCDs".

Chopra, K.L. et al., "Transparent Conductors—A Status Review", Thin Solid Films, 102 (1983) 1–46, *Electronics And Optics.*

Primary Examiner—Nam Nguyen
Assistant Examiner—Steven H. VerSteeg
Attorney, Agent, or Firm—Pennie & Edmonds LLP

[57] ABSTRACT

A reconfigurable mask for forming erasable patterns is disclosed. The mask includes material having optical properties manipulated by nonphysical means. In a preferred embodiment, the mask includes a liquid crystal array formed by materials that are transparent to the exposure light. A phase-shift mask can also be formed by controlling the refractive index of each cell. The mask can be used to form mask patterns that compensate for overexposure at corners of a mask pattern.

9 Claims, 16 Drawing Sheets

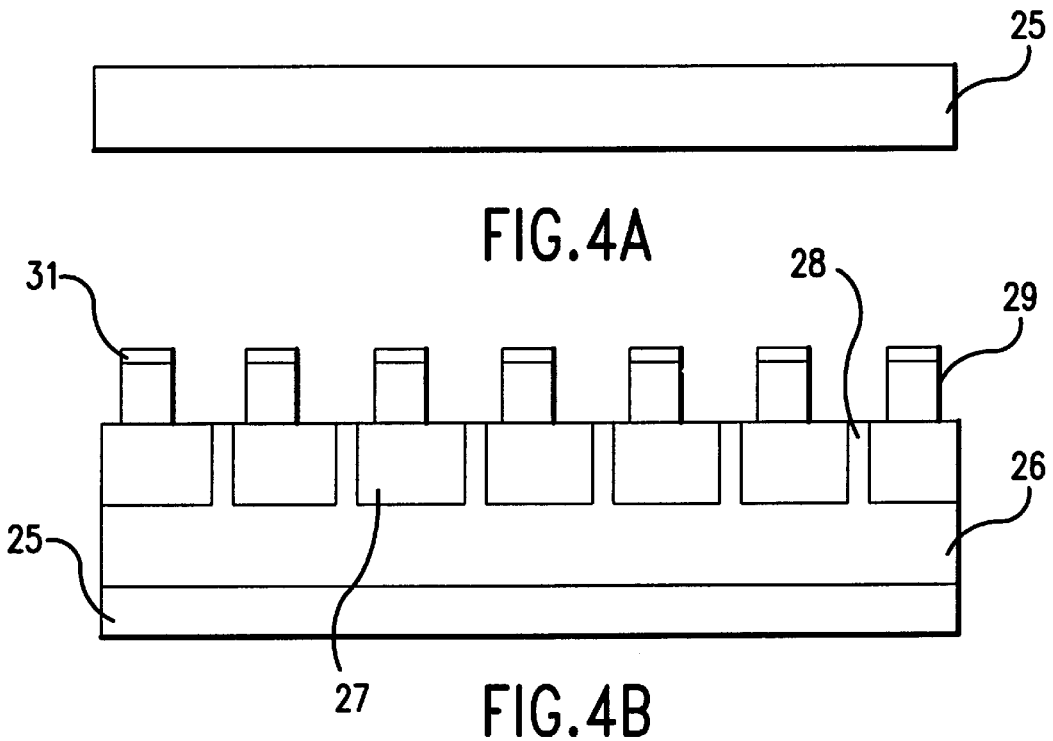
FIG.4A
FIG.4B
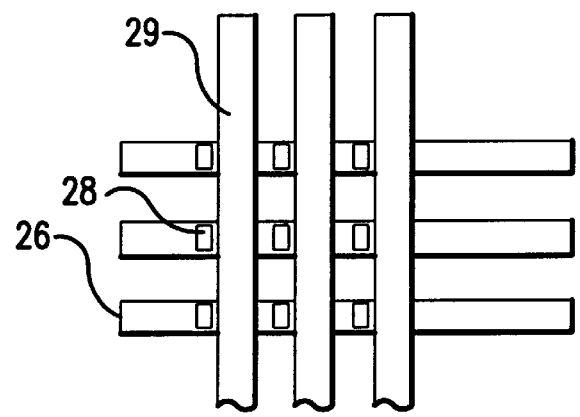
FIG.4C
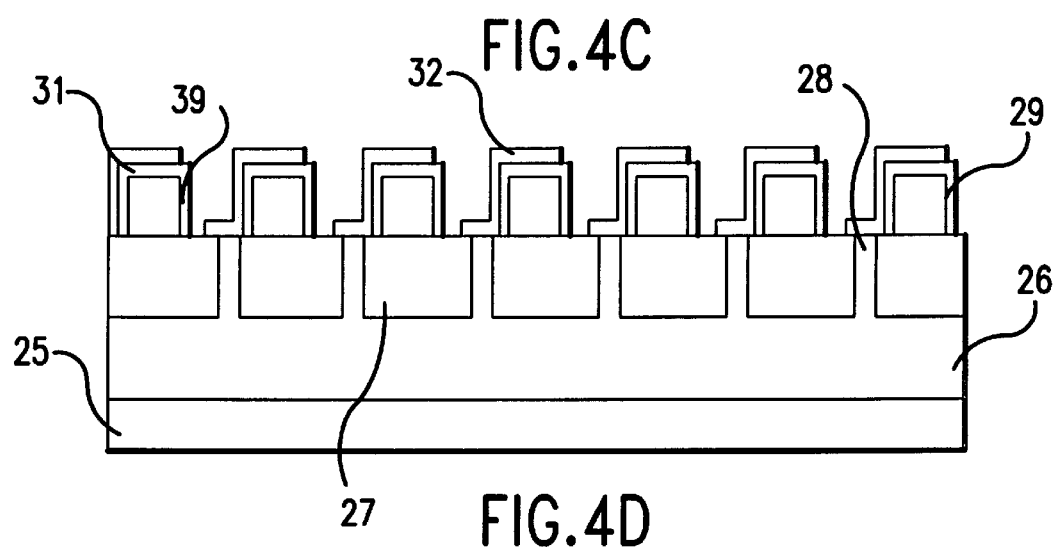
FIG.4D

RECONFIGURABLE MASK

FIELD OF THE INVENTION

The present invention relates to photolithographic masks used in a photolithographic system to fabricate semiconductor devices and the like. More particularly, the invention relates to photolithographic masks that can be reconfigured to form different mask patterns.

BACKGROUND OF THE INVENTION

In the semiconductor integrated circuit ("IC") industry, an IC product concept is first implemented by designing circuit schematics. To realize the designed circuit, a mask layout comprising a series of layers of patterns is generated by layout engineers. Each layer of patterns is then made into a photolithographic mask, which is later used to fabricate a semiconductor chip embodying the designed circuit.

An integrated circuit is made using a sequence of processes performed on a semiconductor substrate. The processes performed on the substrate include some or all of the following: chemical and physical film depositions, etching, ion implantation, diffusion, annealing or thermal oxidation. Many of these processes require that a pattern of photoresist first be formed on the substrate. The process for patterning the photoresist is called a photolithographic process—it involves first depositing a uniform layer of photoresist on the substrate, next exposing the photoresist layer to optical illumination through a mask, and then developing the exposed photoresist layer. The photoresist layer that results from this process is patterned to form an image that corresponds to the patterns on the mask. Depending on the type of photoresist used, the image is either a positive one or a negative one.

A conventional mask consists of a thin layer of chromium (about 50 nanometers) deposited and then patterned on a glass or quartz substrate. In the photolithography process, the mask pattern size is reduced by a factor of 5 after it is transferred onto the substrate by a lithographic exposure system. The pattern is binary; that is, it is either opaque or transparent. In a conventional optical lithography system, the image resolution and the depth of focus are determined by the wavelength of the illumination light and the numeric aperture of the optics and not by the mask itself.

In contrast with the binary mask, a phase-shift mask contains phase shifters to enhance the resolution of the mask image, which results in an increased useful lifetime for conventional lithography systems. One kind of phase-shifter is comprised of tiny apertures formed along the peripheries of a chrome mask pattern and a layer of transparent material formed on the apertures. The thickness of the transparent material is such that light passing through the aperture is 180 degrees out of phase with the light passing by edges of the chrome mask pattern. As a result of the interference between the light passing through the apertures and the light passing by the edges, the contrast of the projected mask image is enhanced.

In the last 20 years, lithography innovation has been aimed at improving resolution and alignment accuracy, increasing throughput and reducing defect density. As IC technology advances, the number of layers in an IC has increased and, as a result, the number of photolithographic processes required to fabricate an IC has also increased. Owing to the increasing number of masks needed to make an IC and stringent defect requirements, each set of masks is becoming very expensive. For low volume ICs or prototypes, the mask could be the dominant cost. This becomes an important consideration for prototyping new ICs. Whenever a design modification is required, a new mask must be generated, resulting in increased cost and development cycle time. It is also uneconomical to merge several different mask sets onto a single wafer lot. Thus, the cost of throughput reduction due to loading, alignment, and unloading of masks far out-strips reduction in processing cost.

Therefore, there remains a need for lithography innovation that minimizes prototyping cost and development cycle time. An E-beam (electron beam) direct write system can potentially achieve much of the desired characteristics. In an E-beam system, because the layout is stored in a computer and the photoresist is directly written by an exposure e-beam, no mask is needed. This eliminates the mask cost and the time required to generate the mask. Design modification can be more quickly implemented. In addition, different prototyping products can be merged onto the same wafer lots without reduced throughput. The processing cost, spread among the prototypes on the same wafer lot, can be significantly lowered.

Notwithstanding the aforementioned advantages, the throughput of E-beam lithography is too low to be competitive with conventional optical lithography. It is therefore rarely used except in making masks.

In contrast to the E-beam exposure system, the conventional chrome mask is rigid and inflexible. Except in cases where defects or errors are very limited, repair of the mask is complicated, difficult, and time consuming. Once it is made, a mask's pattern is considered fixed; it is not possible to alter the pattern at will. Previously known optical lithography systems lack the flexibility afforded by E-beam exposure systems.

It is therefore an object of the present invention to provide a mask having a mask pattern that can be altered at will;

it is another object of the present invention to provide a mask that can be used to form all of the mask patterns that are needed in making a semiconductor or IC;

it is yet another object of the present invention to reduce the cost and the time for forming a mask pattern;

it is a further object of the present invention to provide a mask wherein layout modification and error correction can be implemented quickly and inexpensively;

it is a still further object of the present invention to provide a phase-shift mask having a mask pattern that can be altered at will; and it is a further object of the present invention to provide a mask wherein the mask pattern can be modified using exposure modulation to compensate for imperfections of the projected mask image.

SUMMARY OF THE INVENTION

The present invention provides a reconfigurable photolithographic mask comprising material having localized optical properties manipulated by nonphysical means for a desired mask pattern for projection onto a photosensitive material. Advantageously, the mask forms a pattern that is erasable, allowing new patterns to be formed on the mask. An advantage of the reconfigurable mask of the present invention has as an advantage over the conventional chrome mask is that the same mask may be used to form different mask patterns. Additional advantages include the ability to program the mask with electrical signals to form different patterns, a significant reduction in the time needed to form a mask pattern, and a significant reduction in the cost associated with generating a pattern.

In a preferred embodiment, a reconfigurable mask comprises a randomly addressable liquid crystal pixel array. The liquid crystal pixel array is preferably highly transparent to the light used for exposure. A desired mask pattern is generated by addressing and driving the pixel array with appropriate signals. Preferably, the pixels are small in size (e.g., 0.8 micron by 0.8 micron) and the distance between two adjacent pixels is also small (e.g., 0.2 micron) such that the optical properties of the liquid crystal material between the two adjacent pixels are controlled by the fringe field of the pixels.

More preferably, the reconfigurable mask is connected to addressing and driving circuitry formed at the periphery of the mask, and the mask receives electrical input from a computer-aided design ("CAD") system. The layout data in the CAD system can be quickly transformed into a pattern on the mask.

Because the reconfigurable mask of the present invention can modulate the localized optical properties of the liquid crystal, such as the refractive index, it can be used to form a phase-shift mask with improved image contrast.

The reconfigurable mask of the present invention also provides for exposure modulation to compensate for imperfections of the projected image. For example, by making the area of the mask that forms a corner of a mask pattern less transparent, thus reducing close exposure dose, developed photoresist will have a pattern that is closer to the corresponding mask pattern than that obtained with a conventional chrome mask. This added ability of exposure modulation is due to the localized optical properties of the reconfigurable mask.

The reconfigurable mask of the present invention also provides the ability incrementally to modulate the localized transparency. Thus, by properly biasing cells of the mask to obtain a graded degree of transparency, a semiconductor mesa with sidewalls having different predetermined slopes can be formed.

BRIEF DESCRIPTION OF THE DRAWINGS

Those and other objects, features, and advantages of the invention will be more apparent from the following detailed description in conjunction with the appended drawings, in which:

FIGS. 4A–J illustrate a preferred process to make a bottom LC plate in accordance with the present invention;

DETAILED DESCRIPTION OF THE INVENTION

The present invention provides a reconfigurable mask comprising material having localized optical properties manipulated by nonphysical means. The term "localized optical properties" used here refers to the optical properties of any individual area on the mask. Each individual area can have a different size and shape, and each can be arranged in any fashion to form a mask or a portion thereof. The term "nonphysical means" is used here to refer to any means to manipulate localized optical properties to effect a change in the mask pattern other than by removing or adding material to the mask, as is done with conventional chrome masks. Examples of nonphysical means include electrical, optical, magnetic, or thermal means, or any combination thereof.

A mask pattern is generated by enabling any individual area on the mask to be addressed by nonphysical means to change its optical properties, such as transparency or refractive index. In addition, the nonphysical means allows a mask pattern to be erased and a new mask pattern to be generated on the same mask. With the ability to control the refractive index of individual areas on the mask, a phase-shift mask in accordance with the present invention is also provided.

Additionally, with the ability to control the optical properties of individual areas on the mask, a mask pattern having features designed to compensate for pattern sensitivity can be generated on the mask. Moreover, the mask of the present invention can also be used to generate a pattern having areas with different grades of transparency. Such a pattern can be used in photolithography to make semiconductor devices having sidewalls of different, predetermined slopes.

Further, the optical properties of individual areas on the mask can be separately controlled to enhance the contrast of a mask pattern. Such an ability is not available with conventional chrome masks.

Accordingly, the present invention, by providing the ability to alter optical properties of the individual areas on the mask for pattern formation, reduces the cost associated with forming a mask pattern, increases the flexibility in forming as mask pattern, reduces development turn-around time, greatly enhances mask lithography resolution, and reduces pattern and topological sensitivity.

The present invention replaces the conventional mask used in optical lithography with a reconfigurable mask. In a preferred embodiment, the mask receives electrical input from a CAD system that stores the mask data in a database to form a mask pattern. Once the pattern is formed on the mask, a conventional lithography system can be used to expose photosensitive material, such as a photoresist covering a semiconductor wafer.

Figure 1:
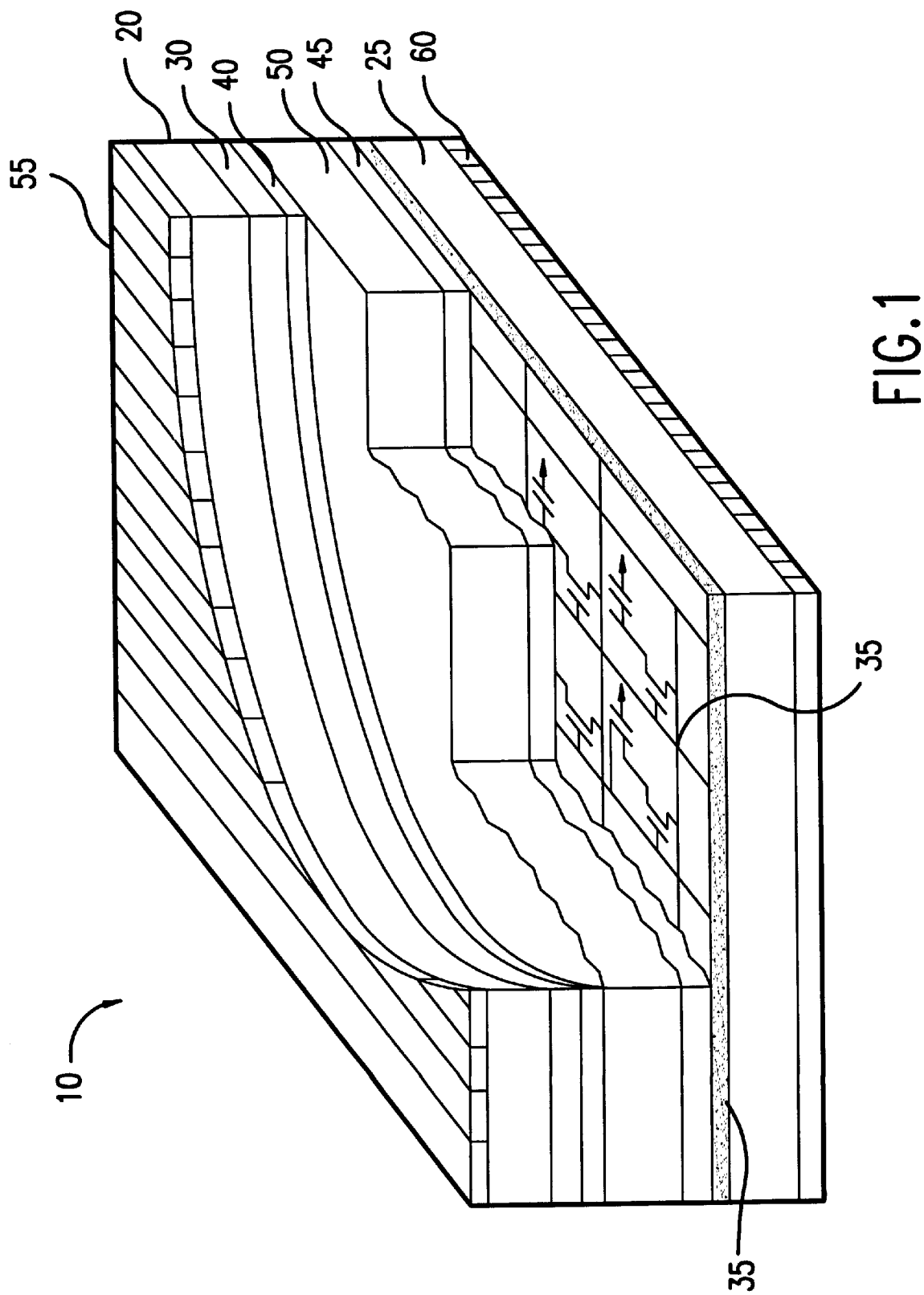
FIG. 1 is a perspective view of a reconfigurable mask of the present invention.

In accordance with a preferred embodiment of the present invention, a reconfigurable mask comprising liquid crystal material is provided. Referring to FIG. 1, a reconfigurable mask 10 comprises two ultra-flat and defect-free quartz plates 20 and 25, spaced uniformly about 1–2 microns apart. (Depending on exposure wavelength, glass plates may be used instead of the more expensive quartz plates.) The inner surface of quartz plate 20 is coated with a conductor layer 30 that is transparent to the exposure light. Conductor layer 30 functions as an electrode biased at a common voltage.

On the inner surface of quartz plate 25, an array 35 of individual capacitive electrodes is formed. A corresponding array of thin film transistors ("TFTs") for access to the capacitive electrodes is also formed on quartz plate 25. Connected to the array of TFTs is a matrix of gate and data lines made of transparent conductors such as indium tin oxide ("ITO").

On transparent conductor 30, a dielectric layer 40 is deposited. Another dielectric layer 45 is formed on array 35. A thin layer of polymer (not shown) on the order of 100 angstroms is deposited on both dielectric layers 40 and 45. A liquid crystal material ("LC") 50 (preferably a nematic LC) is disposed between the polymer layers. On the outer surfaces of quartz plates 20 and 25, two polarizers 55 and 60 having perpendicular polarizations are formed.

The polymer layers are used to align the LC molecules. Each of the polymer layers is rubbed along a single direction so that, when the LC contacts the rubbed polymer layer, the LC molecules in contact with the rubbed polymer become aligned parallel to the rubbing direction. As is known in the art, if two plates are rubbed at a 90 degree angle to one another, the LC disposed therebetween deforms into a twisted structure.

Figure 2A:
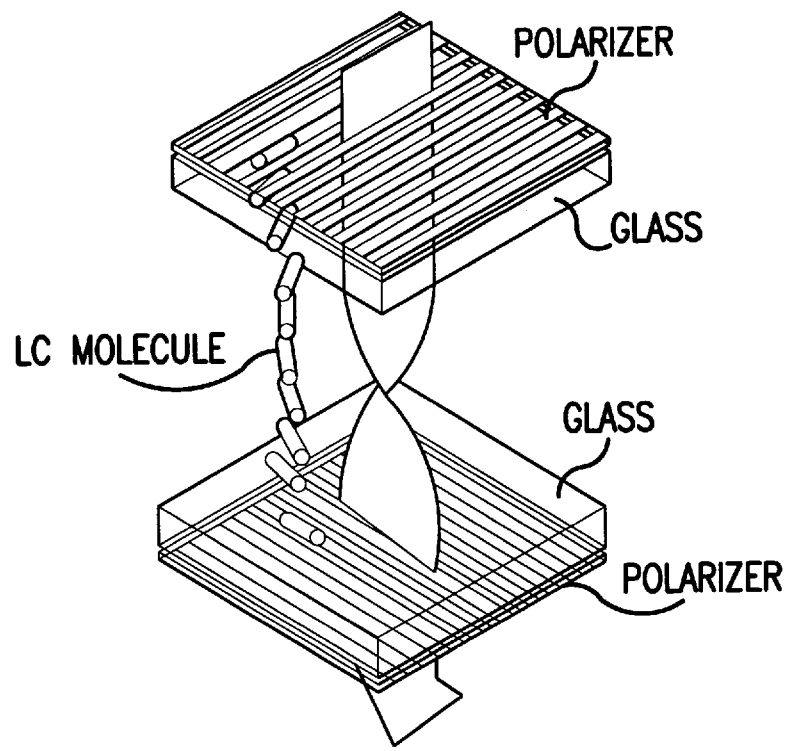
FIGS. 2A–B illustrate the operation of twisted nematic liquid crystal material.
Figure 2B:
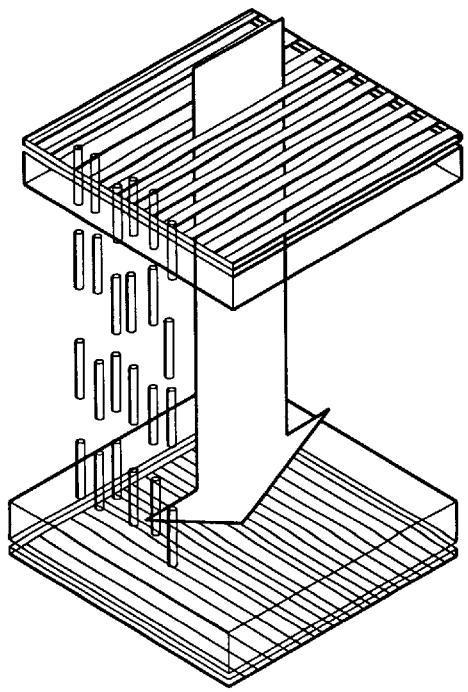

The operation of a single LC cell of the reconfigurable mask of FIG. 1 is now described with reference to FIGS. 2A–B. Referring to FIG. 2A, if the cell is not biased (i.e., no voltage is applied between the top and bottom plates) when polarized light enters a cell, the polarization plane of the light follows the twist of the LC and is rotated by 90 degrees as it traverses through the cell. Because the bottom polarizer is also rotated 90 degrees with respect to the top polarizer, the cell appears highly transparent.

The cell transparency is reduced when an electric field is applied across the cell between the top and bottom plates. As shown in FIG. 2B, when a strong electric field is applied across the cell, the liquid crystal molecules overcome the influence of the rubbing direction and align themselves to the applied field. This leads to a disruption of the twist and consequently removes rotational effect on the polarization of the incident light. As a result, when the incident light transverses the LC and then reaches the bottom polarizer, the light is met with a polarizer having perpendicular polarization, which makes the cell appear opaque.

In the embodiment of FIG. 1, the polarizers are shown to attach to the quartz plates. The polarizers can also be detached or incorporated into the optical lens system of an exposure system to minimize thermal absorption by the mask and the associated thermal distortion.

In the embodiment of FIG. 1, electronics for driving and addressing the arrays are placed on quartz plate 25 alongside mask 10 and are electrically connected to the TFT array. The term "mask" used here refers to the area where a mask pattern is displayed. In a preferred embodiment, the electronics and the TFT arrays are formed on quartz plate 25 as a hybrid.

The process for making the reconfigurable mask of FIG. 1 will now be described with reference to FIG. 3 and FIGS. 4A–J.

Figure 3:
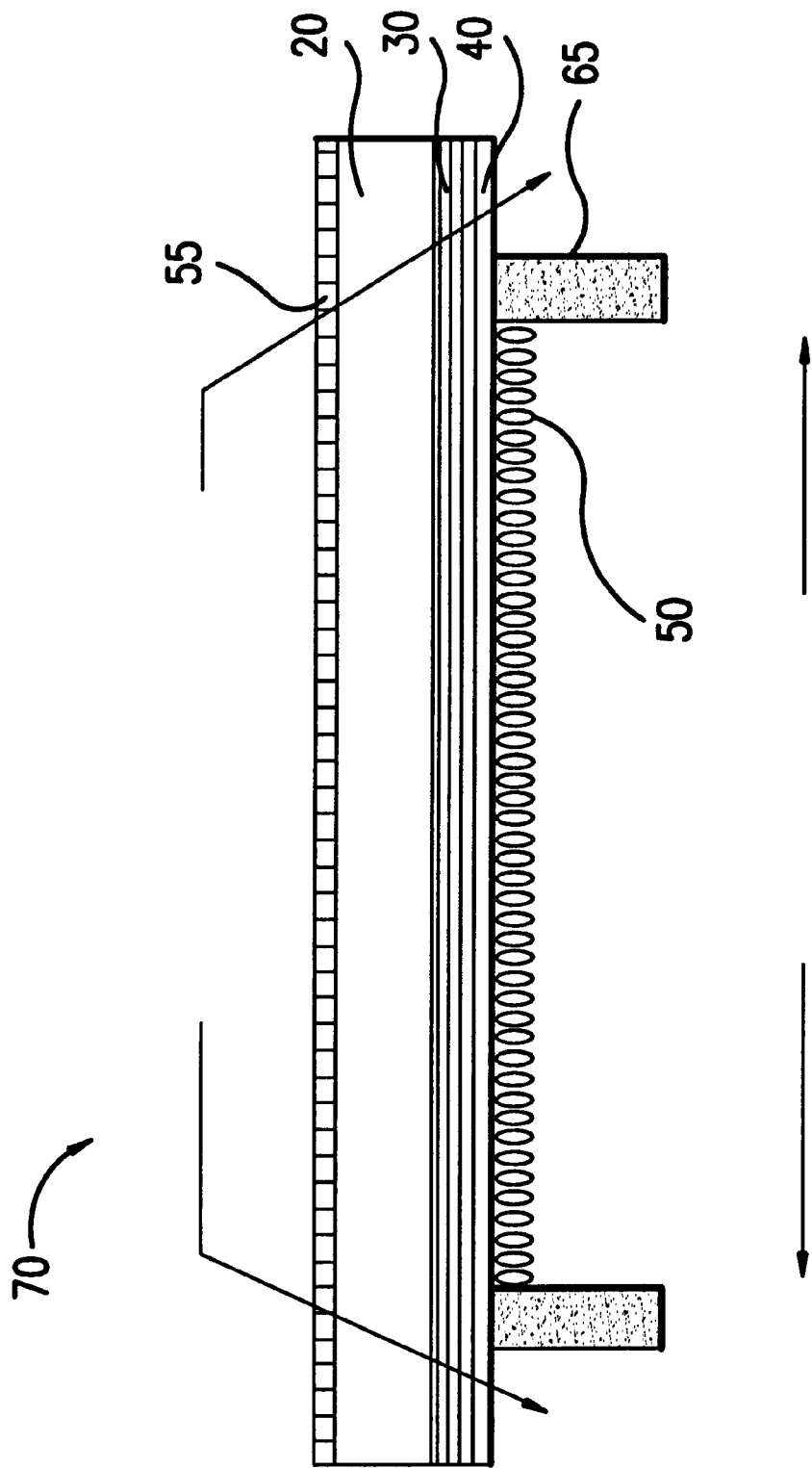
FIG. 3 depicts a cross-sectional view of a top LC plate in accordance with the present invention.

FIG. 3 depicts a cross-sectional view of top quartz plate 20 with elements formed thereon, which together are called a common electrode plate 70. In this drawing, like elements are designated with the same numbers used in FIG. 1.

As shown, the making of common electrode plate 70 according to the present invention consists of first coating ultra-flat quartz plate 20 with a layer of transparent conductor 30. On top of transparent conductor 30, a layer 40 (about 150 to 300 nanometers thick) of dielectric material is deposited. Next, a polysilicon spacer 65 is formed by first depositing a layer of polysilicon of a desired thickness (such as one micron) and then removing the polysilicon material in a central exposure area. This polysilicon spacer will maintain precise spacing between quartz plates 20 and 25. A layer of polymer is then coated on the area of dielectric layer 40 that is inside the polysilicon spacer; the polymer is then rubbed along a desired direction for LC alignment.

Figure 4E:
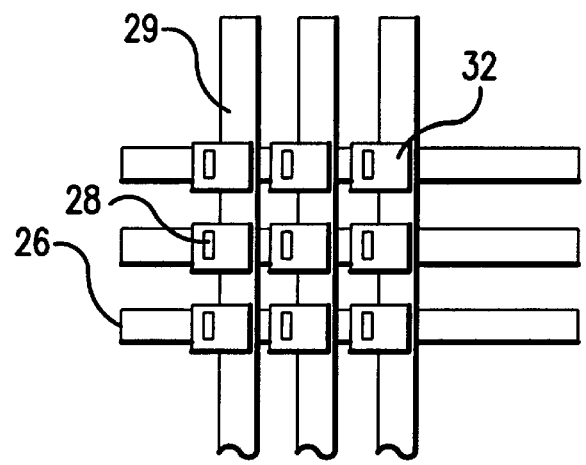

FIGS. 4A–J illustrate how a bottom plate, which includes quartz plate 20 and all the elements formed thereon, is made. Referring to FIG. 4A, the process preferably begins with ultra-flat quartz plate 25. The perimeter of quartz plate 25 may contain x-y address decoder circuits and driver circuits (not shown). These circuits can be fabricated on bonded and etched-back silicon on insulator ("SOI") material or large-grain polysilicon thin film. These circuits are processed through all the high temperature steps required to make the address decoder and the driving circuits and are then finished with necessary metallization levels. The decoder and driver circuits are coated with an insulating dielectric layer (not shown) in which via holes are opened for making electrical contacts to the decoder and driver circuit.

Then, a layer of transparent conductor (not shown) is deposited on the dielectric layer over the decoder and driver circuits, making electrical contact to them through the via holes formed in the dielectric layer. The same layer of transparent conductor is also deposited on a central exposure area on quartz plate 25 for forming the reconfigurable mask.

Referring to FIGS. 4B and 4C, the first lithography step is then performed to define the transparent conductor in the central exposure area with a line and space about 0.5 micron, followed by reactive ion etching ("RIE") to form transparent electrodes 26. After that, a dielectric layer 27 is deposited over transparent electrodes 26 and then planarized.

In the second lithography step, via holes 28 are opened down to transparent electrodes 26. A second layer of transparent conductor about one micron thick with via hole filling capability is deposited over dielectric layer 27 and via holes 28. Subsequently, a thin layer 31 of dielectric material (about 200 nm thick) is deposited on the second layer of transparent conductor.

In the third lithography step, the composite of the second transparent electrode layer and dielectric layer 31 is then patterned to form electrodes 29 that are perpendicular to the first electrodes 26 and etched anisotropically. After that, a thin dielectric layer on the order of 20–40 nanometers is deposited to cover conformally the whole plate.

Referring to FIGS. 4D and 4E, the dielectric layer that conformally covers the entire plate is then anisotropically etched, exposing via holes 28, while leaving a thin dielectric layer 39 on the sidewall of transparent conductor electrodes 29. A thin layer of amorphous semiconductor material is then deposited conformably on the entire plate and patterned in the fourth lithography step to define thin film semiconductor regions 32, which serve as the body of the TFTs. Semiconductor regions 32 cover via holes 28, which are connected to first electrodes 26.

The structure is then exposed to ion implantation at a direction perpendicular to quartz plate 25. The vertical portions of semiconductor regions 32 are unimplanted and they serve as the TFT channels. Heavily doped regions at the top and bottom of the semiconducting regions form sources and drains of the TFTs, respectively. Transparent conductor electrodes 29 also function as the gate electrodes of the TFTs.

Figure 4F:
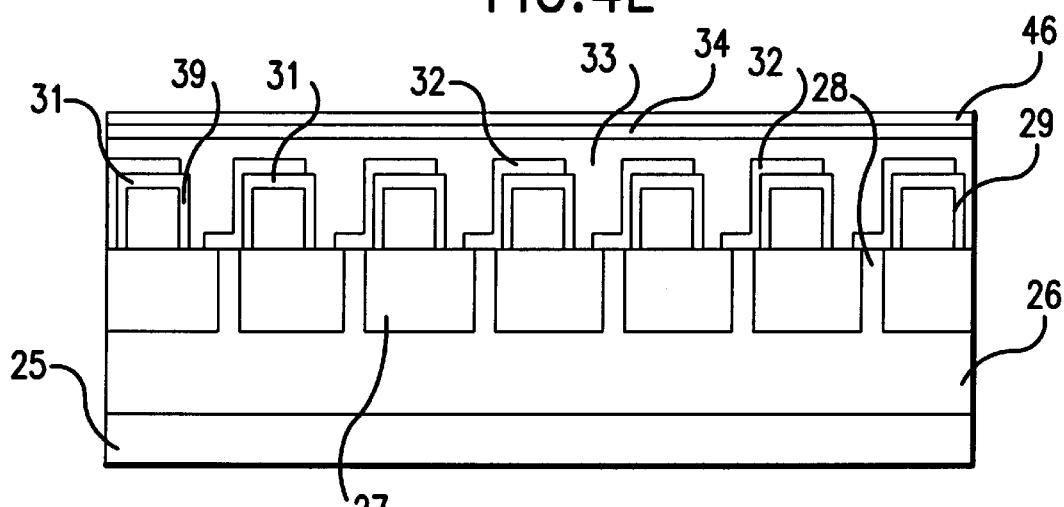

Referring to FIG. 4F, a layer of dielectric material 33 is then deposited over the whole structure and planarized. A third layer of transparent conductor 34 is then deposited, which will be used to form the common bottom plates of additional voltage retainer capacitors. On top of transparent conductor layer 34, a thin layer of dielectric material 46 is deposited.

Figure 4G:
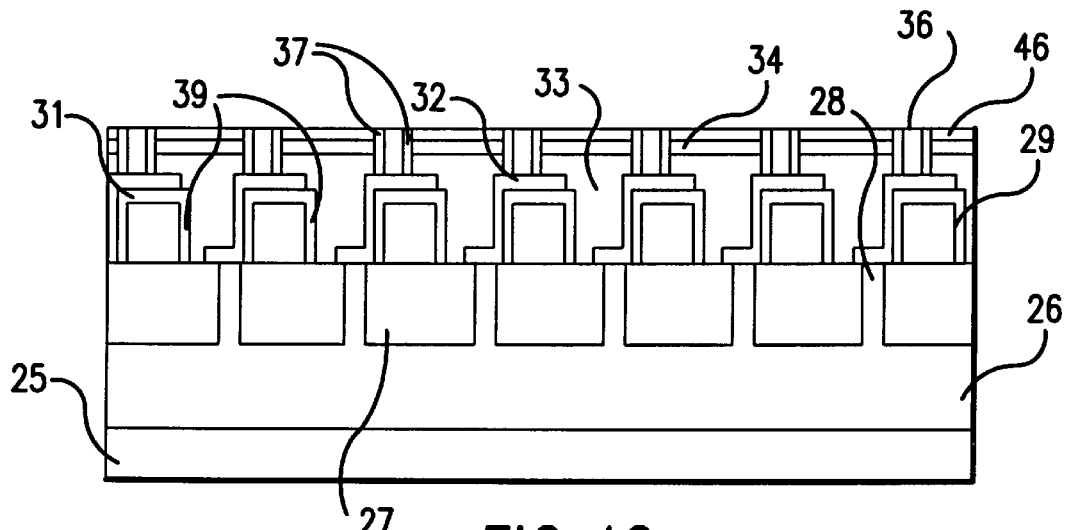
Figure 4H:
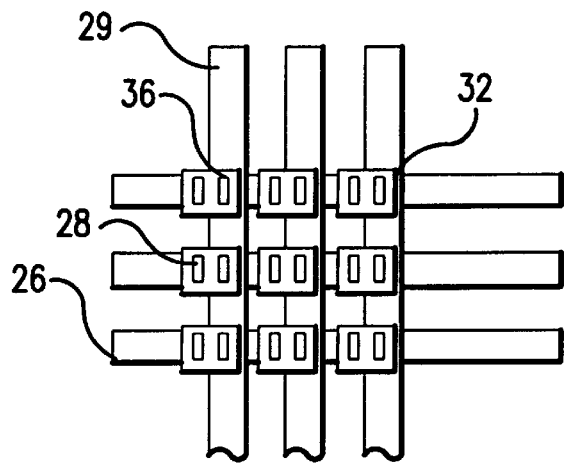

Referring to FIGS. 4G and 4H, in the fifth lithography step, contact via holes 36 are opened to the source electrodes of the TFTs. A conformal thin dielectric layer is deposited and anisotropically etched to form an insulating lining 37 along the sidewalls of via holes 36.

Figure 4I:
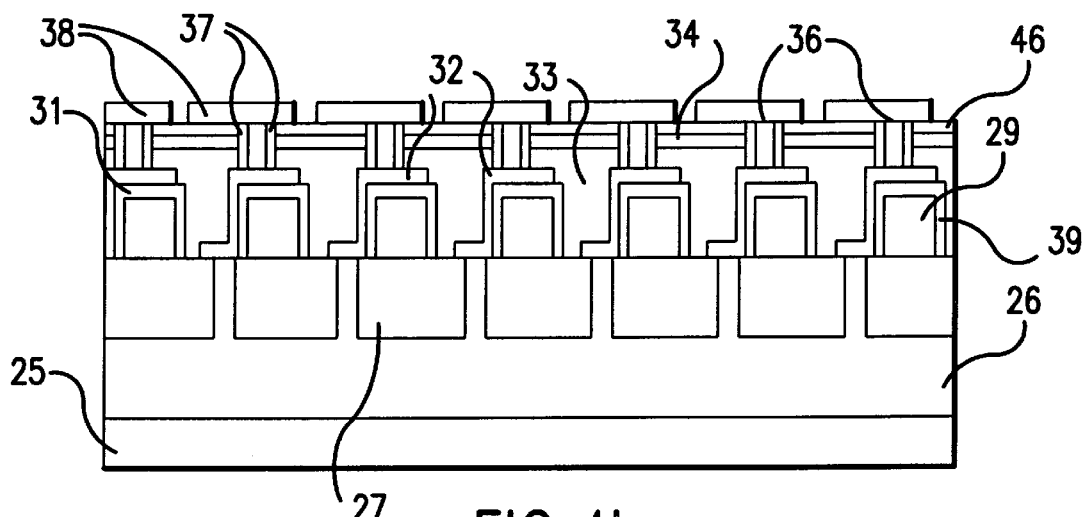
Figure 4J:
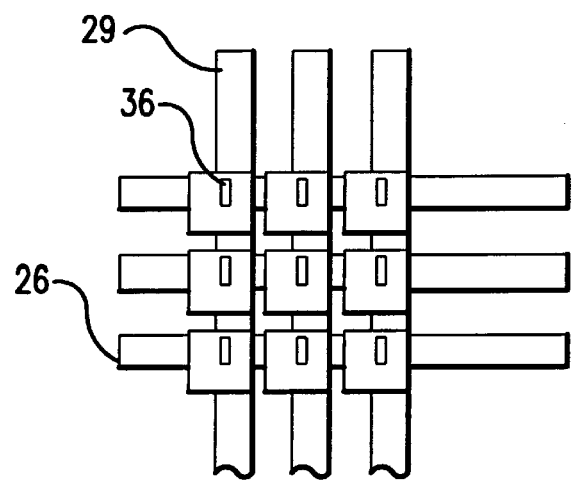

Referring to FIGS. 4I and 4J, a final layer of transparent conductor with conformal via hole filling capability is then deposited. The sixth lithography step is then performed to define LC cell capacitor plates 38. The whole structure is then covered with dielectric layer 45.

After that, a thin polymer layer (not shown) is applied and rubbed on dielectric 45 for aligning the LC.

Figure 5A:
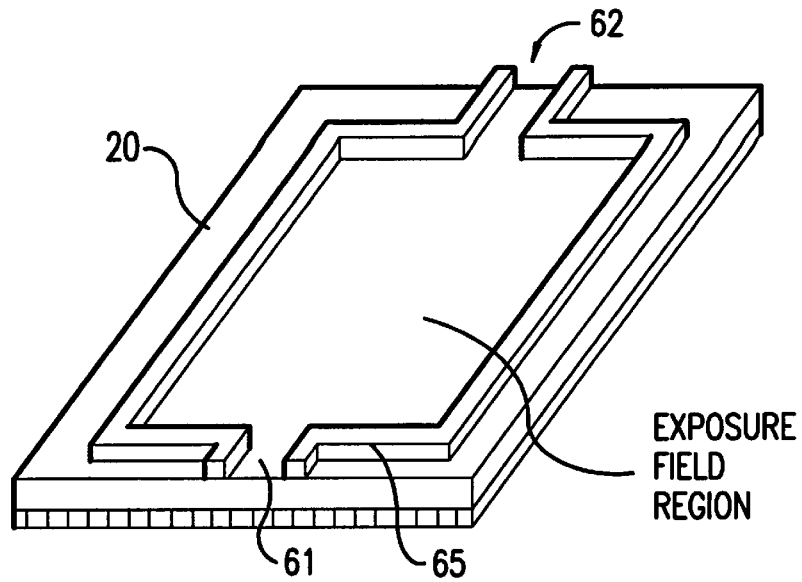
FIGS. 5A–B are perspective views of fabricated top and bottom LC plates.
Figure 5B:
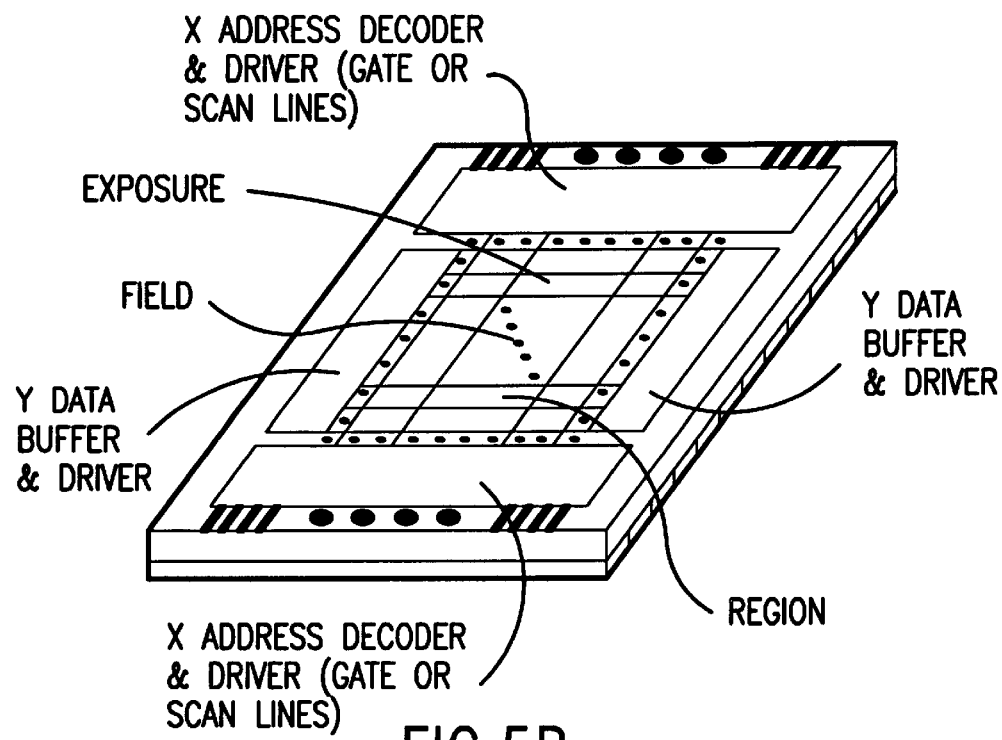
Figure 6:
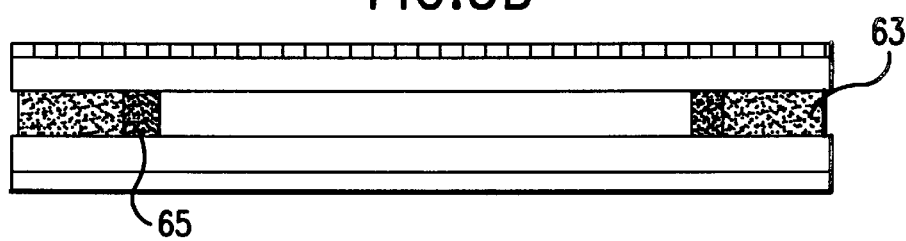
FIG. 6 depicts a cross-sectional view of the reconfigurable mask of FIG. 1.

The two completed quartz plates are illustratively shown in FIGS. 5A and 5B. Once the two quartz plates are made, they are assembled with adhesive 63 applied outside the polysilicon frame. A cross-section of an assembled part is depicted in FIG. 6. Openings 61 and 62 for LC filling and extraction are formed by polysilicon spacer 65. After the adhesive hardens, the gap between the top and bottom is filled with LC. Immediately following the LC filling, the openings are capped with removable adhesive epoxy that does not react with the LC. The whole assembly is then annealed at a temperature above the LC clearing point. The LC is then aligned with the rubbing direction and the sealing material is hardened. It is important that the capping epoxy be removable. Provision must also be made for removing and reworking the LC in case of imperfections or LC aging.

The term "top plate" or "bottom plate" is used here merely for designation purposes. It is not a limitation on which direction is used for light exposure; the exposure light can be projected through either the top or the bottom plate.

In making the TFT-capacitor array, consideration is given to making a reconfigurable mask for an i-line photolithography process with an exposure wavelength at 356 nanometers (with the equivalent photon energy of about 3.4 eV). There are many materials that can be used to form transparent conductors 26, 28, 29, 34, and 38. The most preferred material is indium tin oxide ("ITO"). It has low resistivity ($2\times10^{-4}$ Ω cm). Its effective optical bandgap increases (up to 4.2 eV) as doping concentration increases, owing to the Moss-Burstein effect. Therefore, ITO has high transparency at an exposure wavelength of 356 nanometers.

Because transparent conductor layers 28 and 38 are expected to fill in via holes, the ITO is deposited by a low pressure chemical deposition process ("CVD"). The refractive index of ITO is about 2. Thus, for index matching, each of the various dielectric layers 27, 33, and 45 preferably has a refractive index close to 2.

To increase the effectiveness of the voltage retaining capacitor, dielectric layer 45 is preferably made of material having a high relative dielectric constant, $\epsilon$, such as $Ta_2O_5$ or $(BaSr)TiO_3$ ("BST"). Material having bandgap energy ($E_g$) greater than the incident photon energy of 3.4 eV, such as diamond ($E_g \cong 5.5$ eV), $Ga_xAl_{1-x}N$ ($E_g \cong 3.47$ eV–6 eV) and ZnS ($E_g \cong 3.68$ eV), are most preferable for making TFTs.

In addition to the materials mentioned above for forming the body of TFTs, the well established amorphous Si ("α-Si") material can also be used. Since an α-Si TFT absorbs the incident photon, it will appear as a lithography defect if imaged on the resist. Therefore, special provision must be made to accommodate the presence of the α-Si TFT.

The α-Si TFT size can be made smaller than the resolution power of the lithography system. To reduce absorption, film thickness is minimized. A vertical channel TFT, such as the one shown in FIGS. 4A–J, reduces transistor size, light absorption, and the associated photo-induced leakage. The α-Si TFT can also be placed at the center of a pixel, far away from the focal plane of the mask. By using a combination of these techniques, the image of the α-Si TFT as projected on the photoresist will be unresolved and diffused.

Because of the high resolution required for a mask, pixel size should generally be as small as possible. However, the choice of pixel size depends on the intended application. For example, for a printed circuit board, the pixel size is preferred to be about 20 microns on the side and, for advanced IC applications, the pixel size is preferred to be about 1 micron on the side. A pixel size of 1 $\mu$m on the side forms a 0.20 $\mu$m image pixel when projected by a known 5:1 reduction projection printer. A 5 cm×5 cm reconfigurable mask, which prints chips 1 cm on the side, contains 50,000 by 50,000 transparent conductor electrodes and thus, a total of 2.5 billion LC cells, each containing a TFT-capacitor pair. To achieve reasonable yield, the production environment and fabrication tools of the mask must be extremely clean.

When deep UV lithography becomes feasible, for example, at a wave length of 248 nm, transparent conducting oxide and TFT material with effective optical band gaps greater than 5 eV should be used in making CM.

Figure 7:
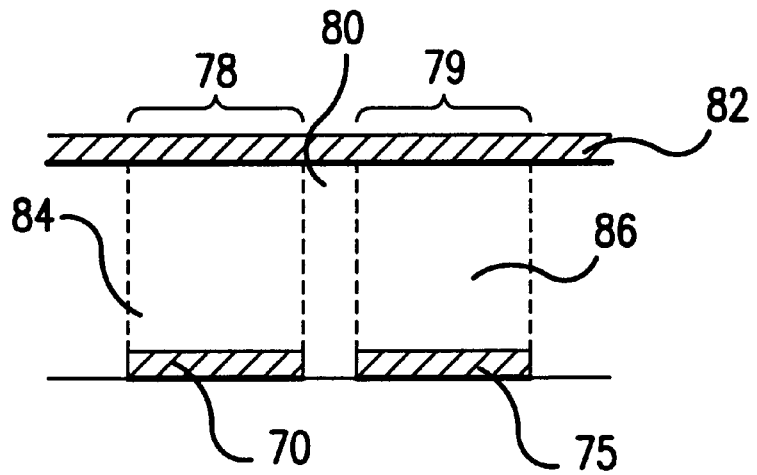
FIG. 7 illustrates two adjacent cells of the reconfigurable mask of FIG. 1.

The distance between two adjacent pixels is minimized to achieve better resolution and better control of the LC between the pixels. Referring to FIG. 7, which illustrates two adjacent pixel capacitor plates 70 and 75, LC materials 84 and 86 are formed between a common electrode 82 and capacitor plates 70 and 75, respectively. LC material 80, however, is not directly between common electrode 82 and either of capacitor plates 70 and 75. To control the optical properties of LC material 80, the distance between adjacent capacitor plates 70 and 75 is made sufficiently small that LC material 80 is controlled by the fringe field of pixels 78 and 79. In a preferred embodiment, each of the capacitor plates is about 0.8 micron by 0.8 micron and the distance between two adjacent capacitor plates is about 0.2 micron.

Figure 8:
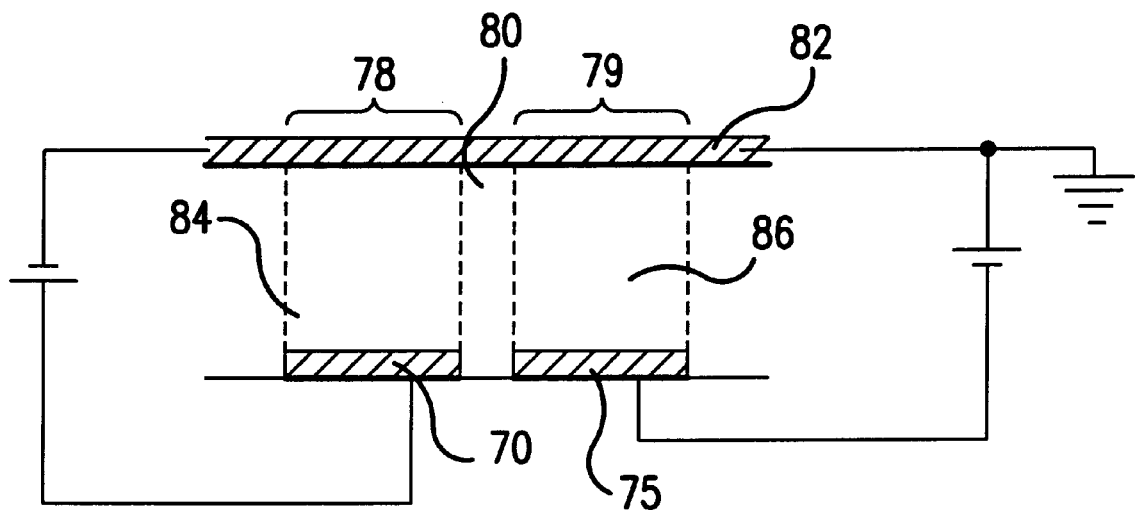
FIG. 8 illustrates compensation of the fringe field effect in accordance with the present invention.

To improve the contrast of a mask pattern formed on the reconfigurable mask of the present invention, adjacent pixels on the edges of the mask pattern can be biased to reduce fringe effect. Referring to FIG. 7, if cell 78 is at the edge of an opaque pattern and it is opaque, and cell 79 is transparent, LC material 80 between cells 78 and 79 will be controlled by the fringe field of cells 78 and 79. LC material 80 will be in a state between opaque and transparent, resulting in reduced image contrast. According to the present invention, control electrode 75 can be biased to compensate for the effect of the fringe field from cell 78. For example, as shown in FIG. 8, if control electrode 70 is biased by a positive voltage to make call 78 opaque, adjacent control electrode 75 is then biased by a small negative voltage such that LC material 80 is substantially transparent. To maintain cell 79 transparent, the negative voltage applied to plate 75 should be sufficiently small such that the field in LC 86 is below a transition field of LC 86. If the field is above the transition field, cell 79 will appear substantially opaque.

Figure 9A:
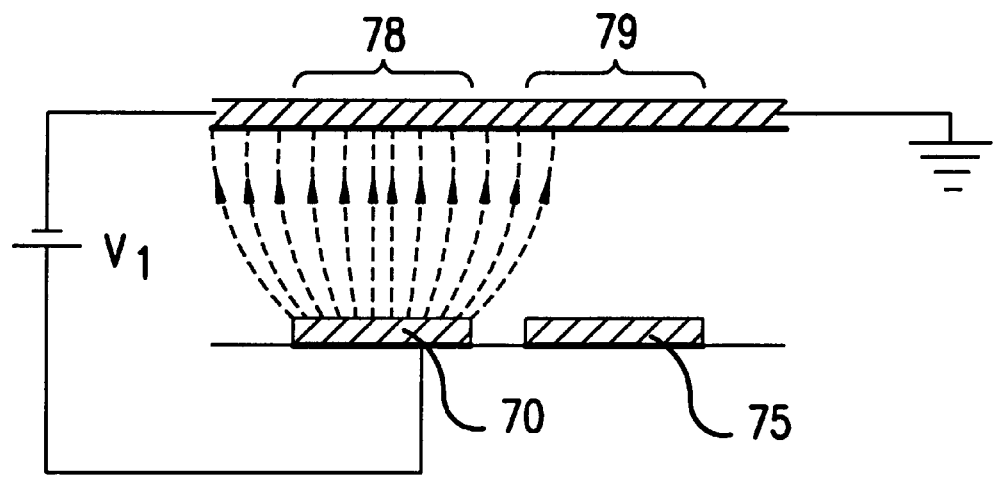
FIGS. 9A and 9B depict electrical field distribution with and without a compensated fringe field, respectively.
Figure 9B:
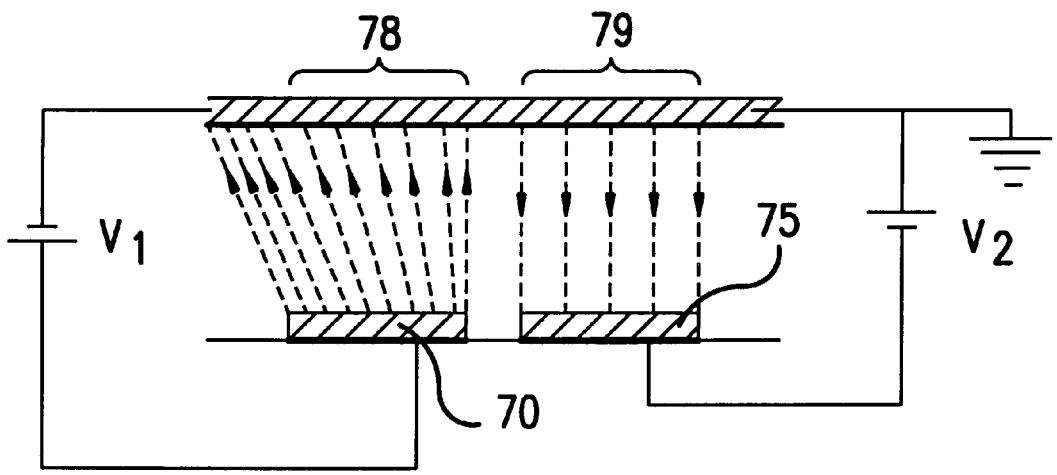

The compensation of fringe field is further illustrated in FIGS. 9A and 9B. FIG. 9A depicts the field distribution when electrode 75 is not biased to compensate for the fringe field effect by electrode 70. FIG. 9B depicts the field distribution when a negative voltage V is applied to electrode 75 to compensate for the fringe field effect by electrode 70. Note that due to the negative voltage applied to capacitor plate 75, there is a weak electric field in the LC of cell 79.

Figure 10:
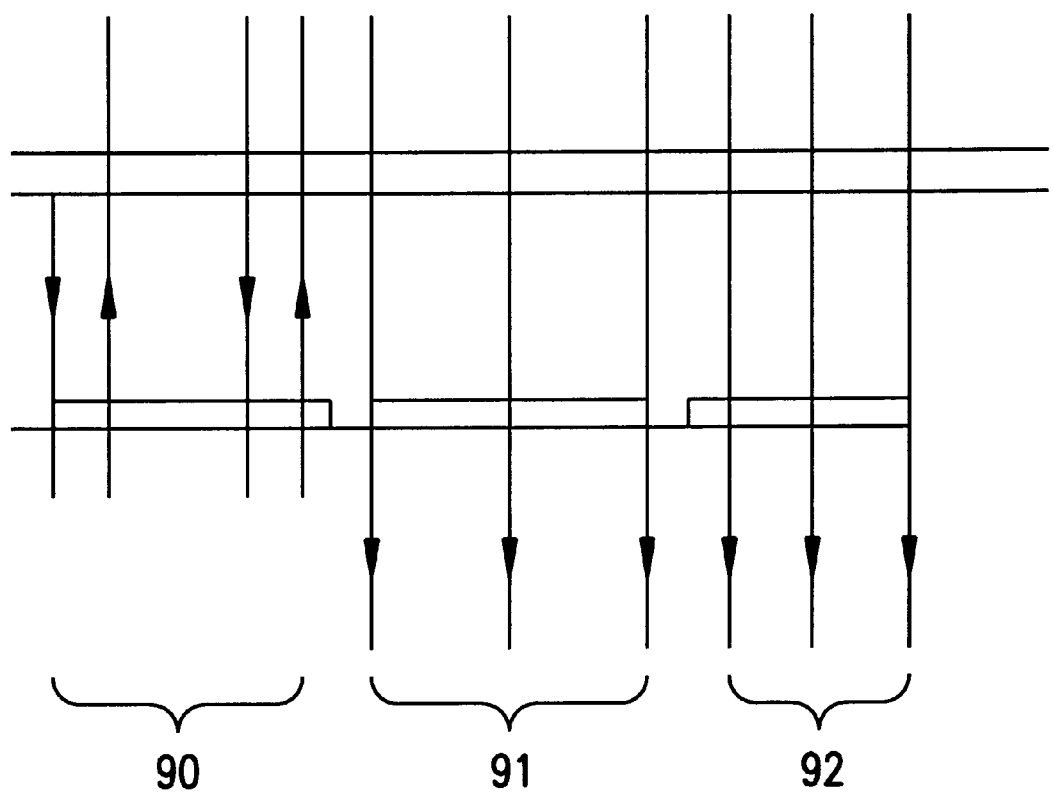
FIG. 10 depicts a reconfigurable phase-shift mask in accordance with the present invention.

In accordance with the present invention, the pixel array of the mask of FIG. 1 can also be biased to form a phase-shift mask. Referring to FIG. 10, forming a mask pattern by the reconfigurable mask of the present invention, a cell 90 is opaque and cells 91 and 92 are transparent to exposure light. To form a phase shift mask, cell 91 is biased such that, after passing the cell, the exposure light is 180 degrees out of phase with the incident exposure light. This ability of the reconfigurable mask of the present invention to form a phase-shift mask pattern is realized because the localized optical properties of the mask, such as the refractive index of the LC, can be manipulated in a randomly addressed fashion.

Figure 11:
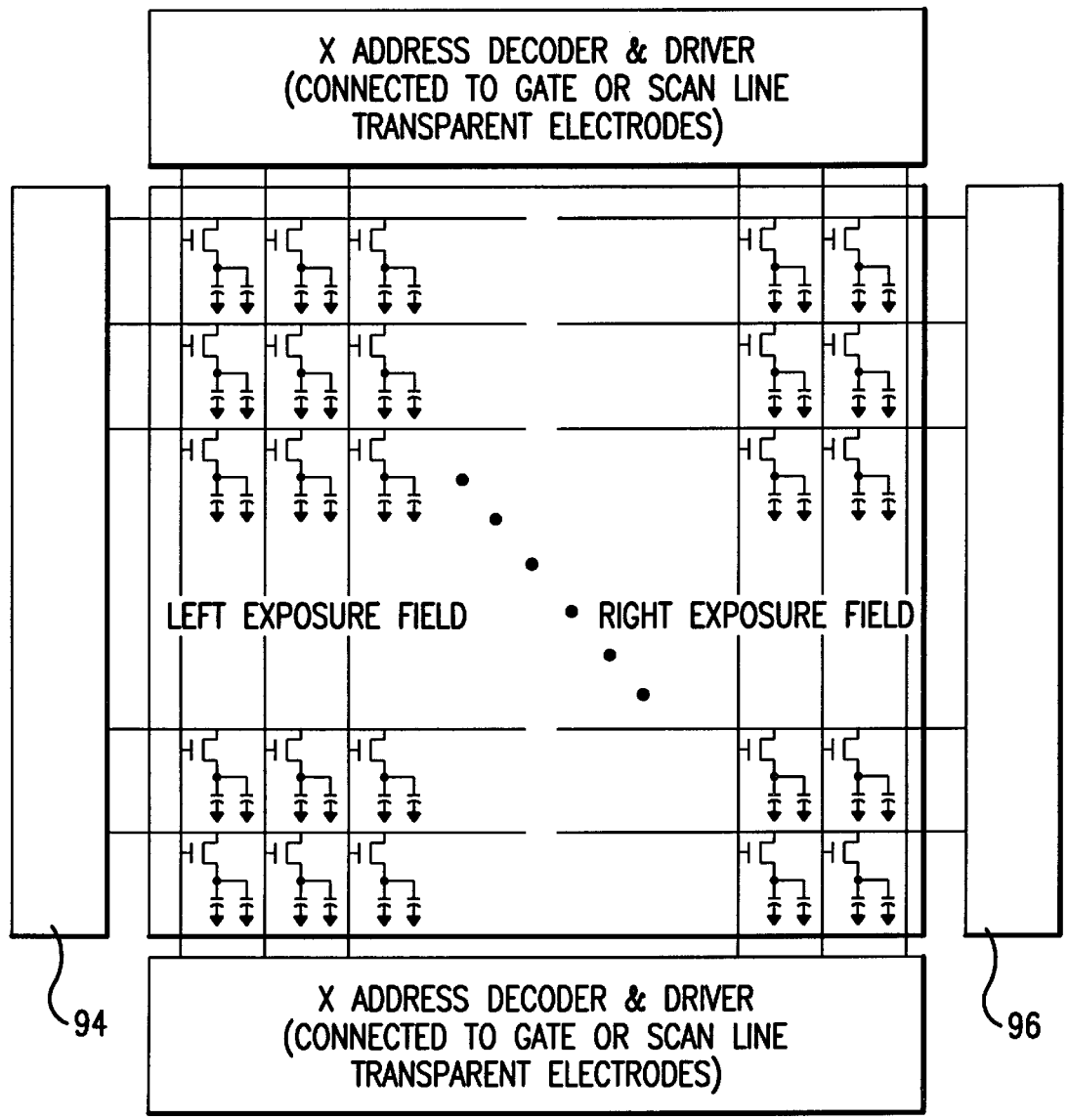
FIG. 11 illustrates the electronics for the reconfigurable mask of FIG. 1.

FIG. 11 shows the architecture for the electronics. As one of gate lines or scan lines is strobed, turning on the all TFTs connected to the line, all inputs to the data lines are read simultaneously. In the meantime, all other scanning lines are kept at a voltage that turns the remaining TFTs to an off state. Because the gate lines are connected to a large number of input gates, the loading capacitance can be very high. Therefore, it is important to minimize the effective resistance by contacting each scan line from both the bottom and the top. The data lines or the drain lines do not have as severe a problem since the drain nodes have low capacitance.

Referring to FIG. 11, in a preferred embodiment, the exposure field is divided into left and right exposure fields. Data for the left exposure field is provided by a left data buffer 94. Data for the right exposure field is provided by a right data buffer 96. This arrangement reduces the time required to scan the entire exposure field.

Because of the large number of gate lines, the scanning period is quite long. In order for the cell voltage to remain approximately constant, the liquid crystal, TFT, and capacitor in each cell have very high resistivity. Preferably, phenyl cyclohexane derivatives are used as the liquid crystal material.

To further reduce the scanning time, the exposure field can be further divided into several areas. Each of the areas is scanned by a scanning amplifier buffer circuit (not shown) formed, preferably, in the center of the area. Because of the proximity of this buffer circuit to the TFTs within the area it is located, the delay caused by the gate lines is significantly reduced. Preferably, the buffer circuit is made of material that is transparent to the exposure light. The buffer circuit, however, can also be made of silicon material—in such case, re-exposure of the area blocked by the silicon buffer circuit is required to repair the absorption of exposure light by the silicon buffer layer.

Figure 12:
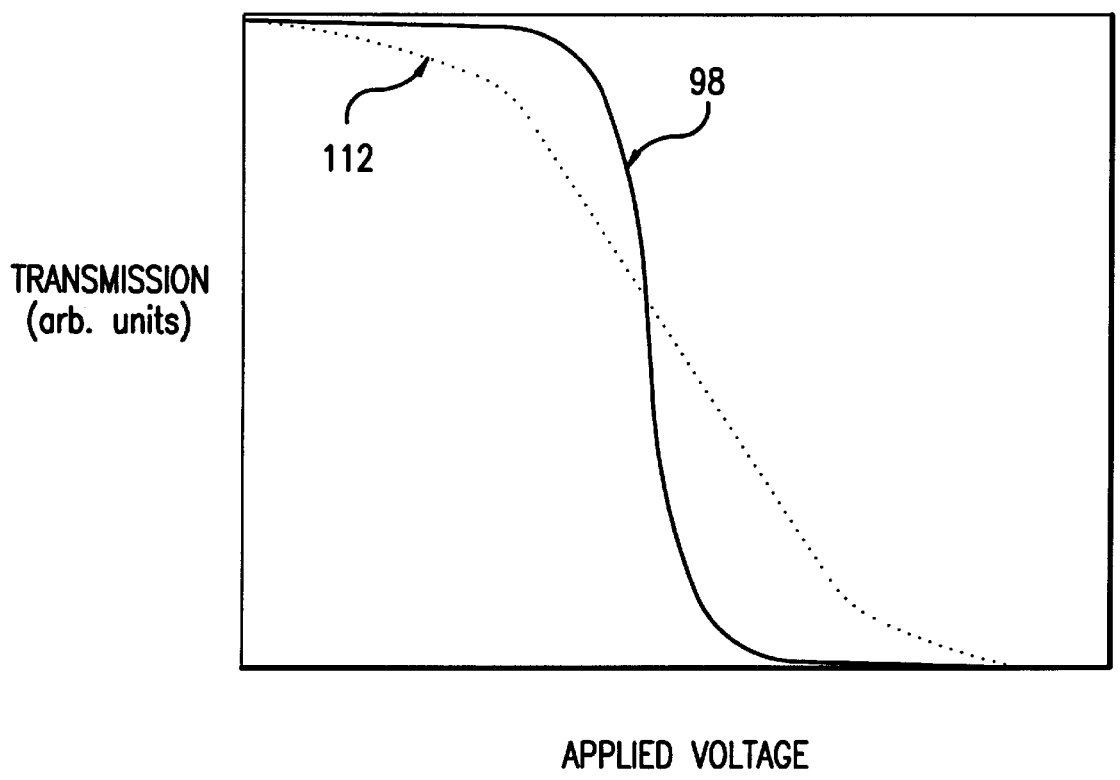
FIG. 12 shows a comparison of transmission between two types of liquid crystal material.

FIG. 12 shows two curves of transmission versus root-mean-square ("rms") voltage applied across a normally transparent LC cell in arbitrary units. Using a super-twisted nematic LC cell, a very steep transition region can be obtained. This is well suited for use as a binary reconfigurable mask. The bias for the opaque state can be at a voltage far above the transition point. Voltage variation over the scanning period would result in very little change in transmitted photon dose. Photoresist exposure will thus be very well controlled.

Figure 13:
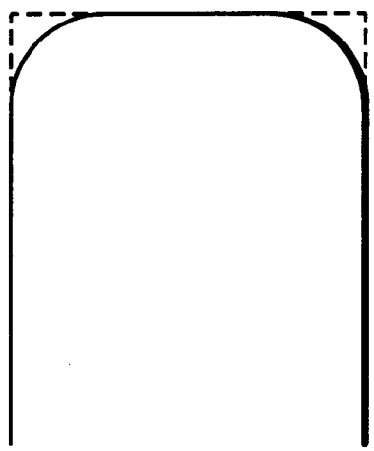
FIG. 13 illustrates a round-corner photoresist obtained without exposure modulation.

In accordance with the present application, a reconfigurable mask may be used, for the purpose of exposure modulation, to compensate for pattern sensitivity. As depicted in FIG. 13, the corners of a long rectangular photoresist in an open field are generally rounded (the dashed line represents the desired shape). Using the reconfigurable mask of the present invention, the pixels around the corners of the rectangle are biased to reduce the exposure dose for a reduction in rounding.

Figure 14:
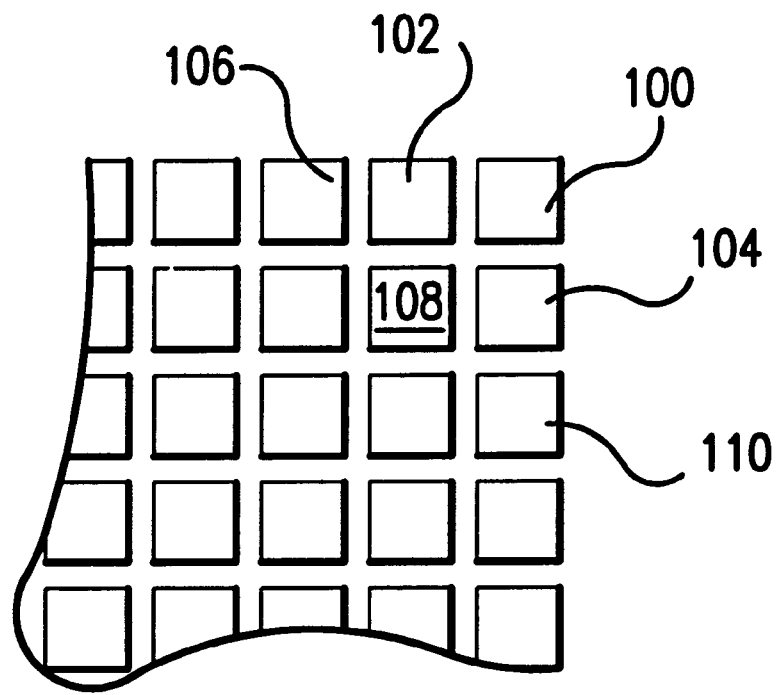
FIG. 14 depicts how certain cells in an array can, with the use of exposure modulation, be used to improve a corner-shape.

As illustrated in FIG. 14, a top view of a portion of a pixel array of the mask, pixels 100, 102, 104, 106, 108, and 110 are biased with reduced transparency to reduce the exposure dose at the corner of a pattern. This is called exposure modulation.

Exposure modulation, however, is difficult to achieve with a sharp transmission curve, such as curve 98 in FIG. 12. A slowly varying transmission curve is better suited for an exposure modulation reconfigurable mask, as shown by a dashed curve 112 in FIG. 12. Unlike the binary reconfigurable mask, the voltage across cells serving the exposure compensation function must be controlled precisely and within a very small voltage range across the whole exposure field. Unless the resist exposure time coincides with the scanning period, a large voltage drift across the cell will cause nonuniform exposure modulation that cannot be tolerated. To ensure precise voltage control, large voltage retaining capacitors are needed. In this case, layer 45 should be made of a high relative dielectric material, typically between 15 to 200, such as $Ta_2O_3$.

The reconfigurable mask described in the previous section is based on the electro-optic properties of the liquid crystal. It is a scanning system because the LC cell needs to be charged to a predetermined voltage to disrupt the twist set up by the alignment layers. If there is a power interruption to the mask, the pattern generated will be lost. Thus, this is a volatile system similar to a DRAM memory.

In addition, the scanning period increases approximately to the cube of the exposure field size. With the increase in refresh period increase, it becomes increasingly difficult to minimize cell voltage ripple and operate a reconfigurable mask in exposure modulation or phase shift mode. Secondly, the time required to generate a new mask pattern will, in the case of merging multiple mask patterns for cost sharing, significantly cut into stepper productivity.

It is desired to have a "nonvolatile" reconfigurable mask, analogues to electrically erasable and programmable read only memory. The mask, once written, has the pattern frozen over an extended period of time. The pattern can be erased by the full frame or localized selectively.

Figure 15:
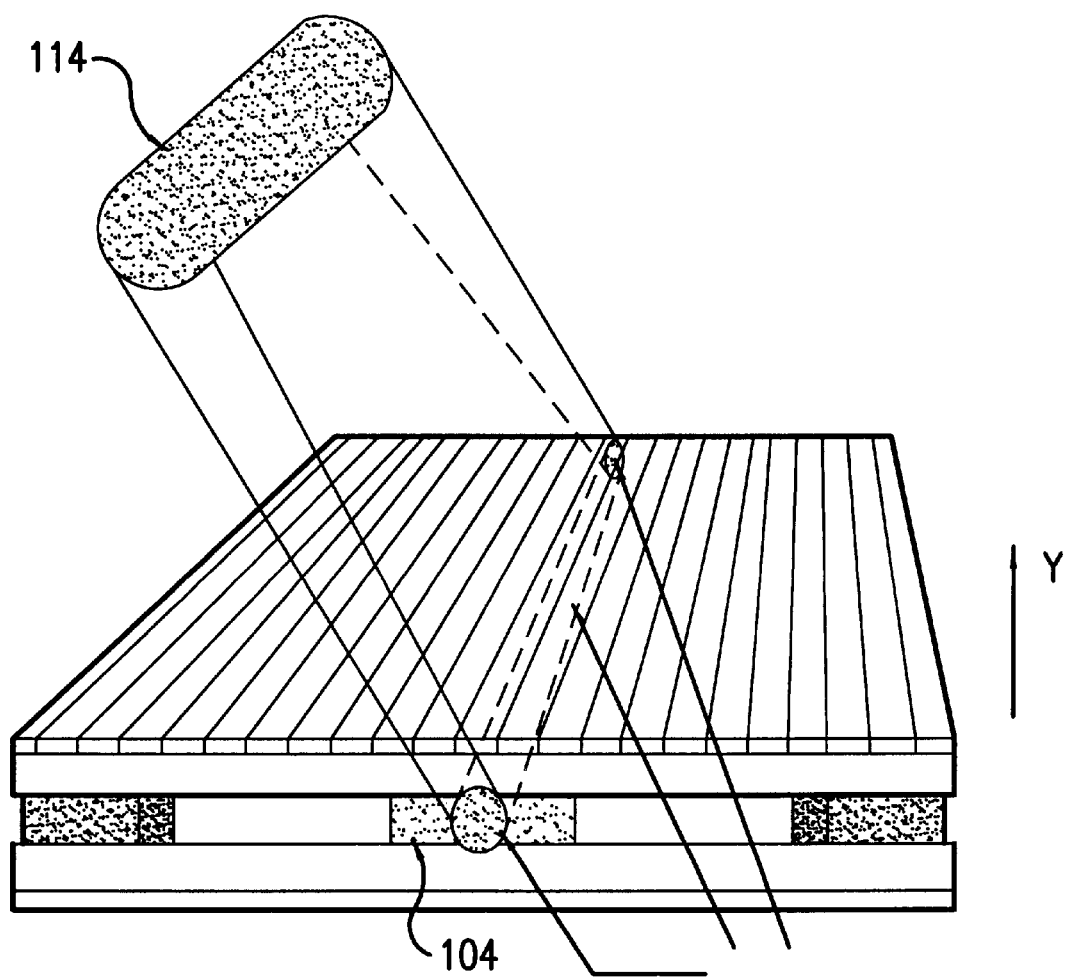
FIG. 15 is a perspective view of a nonvolatile reconfigurable mask of the present invention.

A nonvolatile reconfigurable mask overcomes the difficulty associated with long scanning periods as the mask size increases. Referring to FIG. 15, the basic construction and the electronics for the nonvolatile reconfigurable mask remains the same. The reconfigurable mask is maintained at a temperature below the smectic phase A ("Sa") and nematic phase transition ("Sa-N") temperature. In this phase, the LC viscosity is very high. Because the LC molecules are essentially frozen, the programmed pattern is maintained over an extended period of time. To rewrite locally, energy is transferred to the reprogramming region, e.g., by a sharply focused laser beam 114 to increase the local temperature above the Sa-N transition temperature. The gate lines around the rewrite region is strobed and data are input. A region 104 scanned electronically should be somewhat larger than the laser beam to ensure that all cells experiencing significant viscosity decrease would be reprogrammed. As the laser is removed, the temperature is lowered quickly to below Sa-N transition and the pattern is frozen. Reprogramming the whole frame requires taking a very narrow laser beam, longer than the y dimension of the exposure field, and scanning the laser beam across the whole reconfigurable mask.

Figure 16:
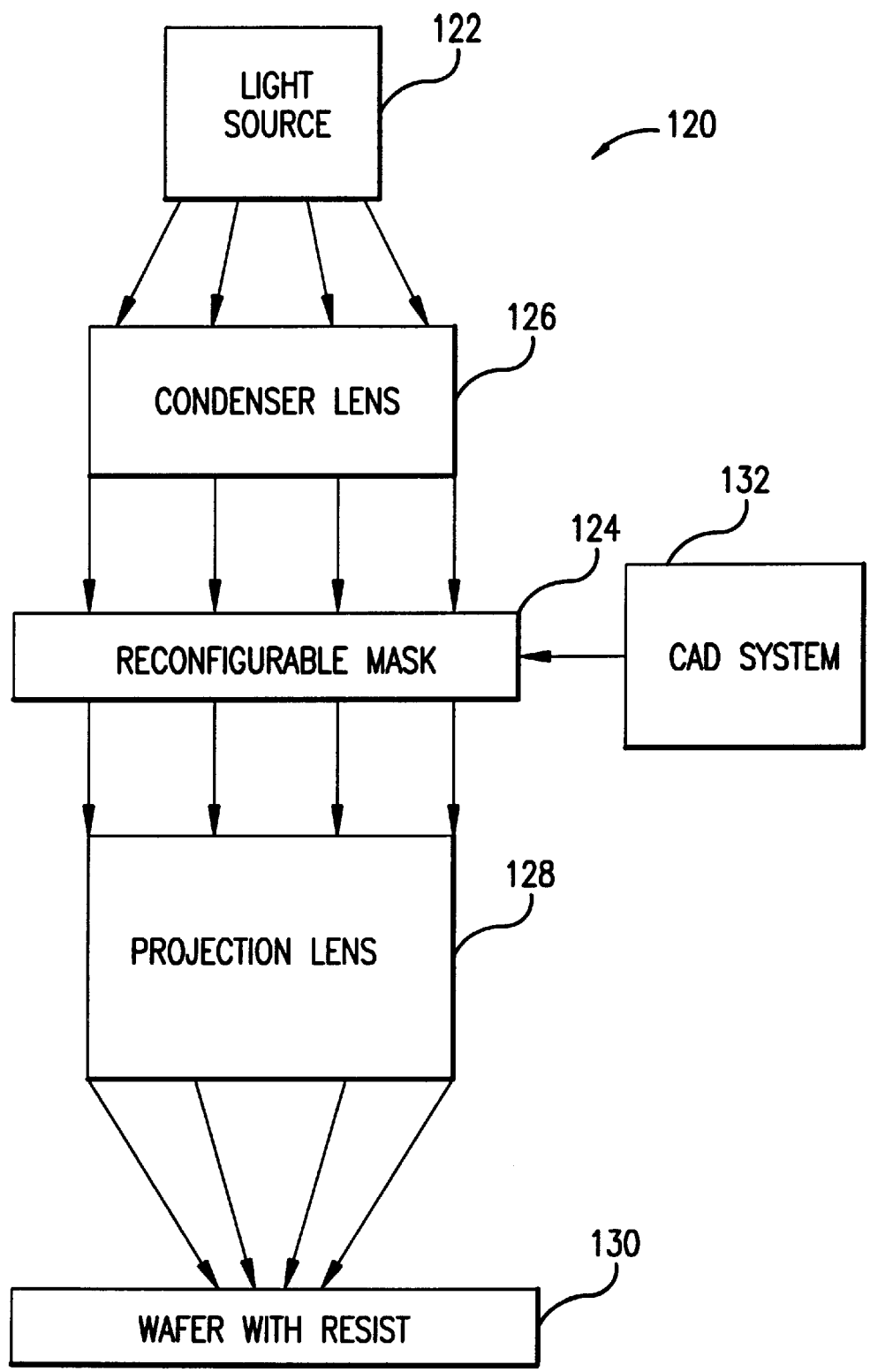
FIG. 16 depicts an optical exposure system using a reconfigurable mask of the present invention.

The reconfigurable mask of the present invention is used in a conventional photolithography system. Referring to FIG. 16, in a preferred embodiment, a photolithography system 120 in accordance with the present invention includes a light source 122 projecting exposure light onto a reconfigurable mask 124 of the present invention through a condenser lens 126. The exposure light, after it passes the mask, is projected by a projection lens 128 onto a semiconductor wafer 130 having a photoresist layer formed thereon. Image reduction is also achieved by projection lens 128. The reconfigurable mask is connected to a CAD system 132 that provides proper electrical signals to the mask to generate desired patterns. This optical lithograph system can be used to make ICs, printed circuit boards, or other products where photolithography is required.

Although FIG. 16 depicts a transmission type of exposure system, it will be apparent to one of skill in the art that the reconfigurable mask of the present invention can also be used in a reflective mode photolithography system.

Because of the ability of the reconfigurable mask of the present invention to manipulate the localized optical properties, features such as mesas having predetermined, different side slopes may be obtained on a single substrate. Examples of the features include, but are not limited to, mesas in semiconductor devices and ICs.

Figure 17:
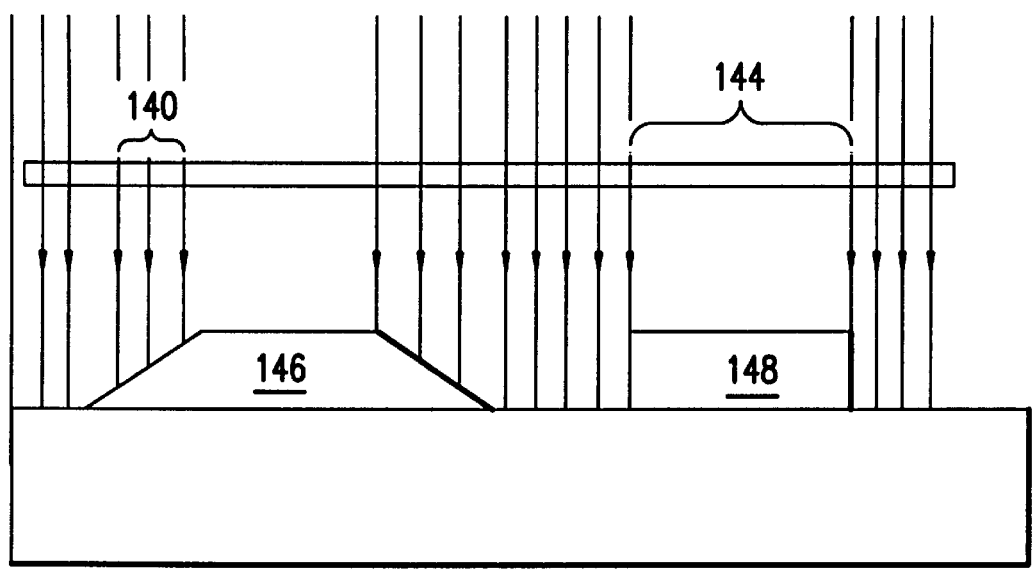
FIG. 17 illustrates photoresist features having different predetermined slopes in accordance with the present invention.
Figure 18:
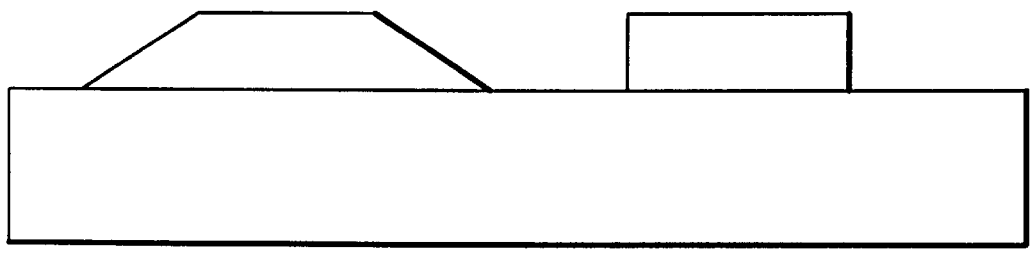
FIG. 18 illustrates semiconductor features fabricated using the photoresist features of FIG. 17.

Referring to FIG. 17, by providing a graded transparency region 140 on the mask, different than a region 144 on the mask, photoresist features 146 and 148 having different side slopes are obtained. Referring to FIG. 18, after etching is performed, the different sloped features are transferred to the etched substrate. In this way, a predetermined, controllable slope can be achieved for any device on a single substrate.

As will be apparent to those skilled in the art, numerous modifications may be made within the scope of the invention, which is not intended to be limited except in accordance with the following claims.

What is claimed is:

1. A reconfigurable photolithographic mask comprising material having localized optical properties manipulated by nonphysical means to form a desired mask pattern to be projected onto a photosensitive material, the reconfigurable mask including at least one area opaque to incident light and at least one other area adjacent to the at least one opaque area transparent to the incident light, the at least one opaque area having localized optical properties manipulated by nonphysical means such that reflected incident light reflected by the at least one opaque area is 180 degrees out of phase with the incident light.

2. The reconfigurable photolithographic mask of claim 1 wherein the material is a liquid crystal material.

3. A reconfigurable photolithographic mask comprising a randomly addressable pixel array for forming a mask pattern that is erasable to form another mask pattern, the reconfigurable photolithographic mask including at least one area opaque to incident light and at least one other area adjacent to the at least one opaque area transparent to the incident light, the at least one opaque area having localized optical properties manipulated by nonphysical means such that reflect incident light reflected by the at least one opaque area is 180 degree out of phase with the incident light.

4. A reconfigurable photolithographic mask, comprising:
material having localized optical properties; and
means for nonphysically manipulating the localized optical properties to form a desired mask pattern to be projected onto a photosensitive material, the nonphysical manipulating means including means for making at least one area of the mask opaque to incident light and making at least one other area of the mask adjacent to the at least one opaque area transparent to the incident light, the at least one opaque area having localized optical properties manipulated by nonphysical means such that the reflected incident light reflected by the at least one opaque area being 180 degrees out of phase with the incident light.

5. The reconfigurable photolithographic mask of claim 4, wherein the means for nonphysically manipulating the localized optical properties comprises a randomly addressable pixel array for forming a mask pattern that can be erased to form another mask pattern.

6. The reconfigurable mask of claim 5, wherein said randomly addressable pixel array comprises a randomly addressable liquid crystal plate.

7. A reconfigurable photolithographic phase shift mask comprising material having localized optical properties manipulated by nonphysical means to form a desired mask pattern to be projected onto a photosensitive material, the reconfigurable mask including at least one area opaque to incident light and at least another area adjacent to the at least one opaque area transparent to the incident light, the at least one opaque area having localized optical properties manipulated by nonphysical means such that reflected incident light reflected by the at least one opaque area is 180 degrees out of phase with the incident light.

8. A reconfigurable photolithographic phase shift mask comprising material having localized optical properties manipulated by nonphysical means to form a desired mask pattern to be projected onto a photosensitive material, the reconfigurable mask including at least one area opaque to incident light and at least another area adjacent to the at least one opaque area transparent to the incident light, the at least one opaque area having localized optical properties such that reflected incident light reflected by the at least one opaque area is 180 degrees out of phase with the incident light.

9. A reconfigurable photolithographic mask comprising material having localized optical properties manipulated by nonphysical means to form a desired mask pattern to be projected onto a photosensitive material, the reconfigurable mask including at least one area opaque to incident light and at least one other area adjacent to the at least one opaque area transparent to the incident light, the at least one opaque area having localized optical properties such that reflected incident light reflected by the at least one opaque area is 180 degrees out of phase with the incident light.

\* \* \* \* \*